US008427266B2

(12) United States Patent
Wu et al.

(10) Patent No.: US 8,427,266 B2
(45) Date of Patent: Apr. 23, 2013

(54) INTEGRATED CIRCUIT INDUCTOR HAVING A PATTERNED GROUND SHIELD

(75) Inventors: Zhaoyin D. Wu, San Jose, CA (US); Parag Upadhyahya, San Jose, CA (US); Xuewen Jiang, Chandler, AZ (US); Jing Jing, San Jose, CA (US); Shuxian Wu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 30 days.

(21) Appl. No.: 13/052,310

(22) Filed: Mar. 21, 2011

(65) Prior Publication Data

US 2012/0242446 A1    Sep. 27, 2012

(51) Int. Cl.
    *H01F 27/32*  (2006.01)
(52) U.S. Cl.
    USPC ........................................... 336/84 C
(58) Field of Classification Search .......... 336/65, 336/84 R, 84 C, 200, 232; 257/531
    See application file for complete search history.

(56) References Cited

U.S. PATENT DOCUMENTS

| 6,753,591 B2 * | 6/2004 | Yu ................................ 257/531 |
| 2003/0222750 A1 | 12/2003 | Kyriazidou |
| 2004/0085175 A1 | 5/2004 | Lowther |
| 2008/0074229 A1 | 3/2008 | Moinian et al. |
| 2008/0136574 A1 * | 6/2008 | Jow et al. .................... 336/200 |
| 2009/0146252 A1 * | 6/2009 | Huang et al. ................. 257/531 |
| 2009/0152674 A1 | 6/2009 | Uchida et al. |
| 2010/0193904 A1 * | 8/2010 | Watt et al. .................... 257/531 |

FOREIGN PATENT DOCUMENTS

| EP | 1 213 762 A1 | 6/2002 |
| WO | WO 2009/101565 A1 | 8/2009 |

OTHER PUBLICATIONS

U.S. Appl. No. 13/052,293, filed Mar. 21, 2011, Wu et al.
Chen, Y. Emery et al., "Q-Enhancement of Spiral Inductor with $N^+$-*Diffusion* Patterned Ground Shields," *2001 IEEE MTT-S International Microwave Symposium Digest*, May 20, 2001, pp. 1289-1292, vol. 2, IEEE, Piscataway, New Jersey, USA.

* cited by examiner

*Primary Examiner* — Tuyen Nguyen
(74) *Attorney, Agent, or Firm* — Kevin T. Cuenot (57) ABSTRACT

An inductor structure can be implemented within a semiconductor integrated circuit (IC). The inductor structure can include a coil of conductive material having a first terminal and a second terminal each located at an opposing end of the coil. The inductor structure can include a patterned ground shield including a plurality of fingers implemented within an IC process layer located between the coil of conductive material and a substrate of the IC. The inductor structure also can include an isolation wall formed to encompass the coil and the patterned ground shield. The isolation wall can be coupled to one end of each finger.

20 Claims, 9 Drawing Sheets

INTEGRATED CIRCUIT INDUCTOR HAVING A PATTERNED GROUND SHIELD

FIELD OF THE INVENTION

One or more embodiments disclosed within this specification relate to integrated circuits (ICs). More particularly, one or more embodiments relate to an inductor structure for use with an IC.

BACKGROUND

The frequency of signals associated with integrated circuits (ICs), whether generated within an IC or exchanged with devices external to the IC, has steadily increased over time. As IC signals reach radio frequency (RF) ranges exceeding a gigahertz, it becomes viable to implement inductor structures within ICs. Implementing an inductor within an IC, as opposed to using an external inductor device, typically reduces the manufacturing and implementation costs of the system requiring the inductor. IC inductors can be implemented within a variety of RF circuits such as, for example, low noise amplifiers (LNAs), voltage controlled oscillators (VCOs), input or output matching structures, power amplifiers, and the like.

Although IC inductors are advantageous in many respects, IC inductors introduce various non-idealities into a system that are not present with external or discrete inductors. For example, an IC inductor is typically surrounded by other semiconductor devices that can generate noise. As IC devices reside over a common substrate material that is conductive, signals and noise generated by an IC device can couple into an IC inductor built over the common substrate material.

Another non-ideality of an IC inductor can include parasitic capacitances that exist between the substrate layer and the metal interconnect layer(s) used to form the IC inductor. Although IC inductors typically are built using one or more metal interconnect layers that reside farthest from the substrate layer, finite parasitic capacitances exist between the substrate layer and the metal interconnect layer(s). These parasitic capacitances facilitate coupling of signals between the IC inductor and the substrate layer.

Yet another non-ideality of IC inductors relates to electric fields. Coupling of the electric fields of an IC inductor can induce eddy currents within the substrate layer. The eddy currents can generate losses that reduce the quality factor, or so called "Q," of the IC inductor.

SUMMARY

One or more embodiments disclosed within this specification relate to integrated circuits (ICs) and, more particularly, to an inductor structure for use with an IC.

An embodiment can include an inductor structure implemented within a semiconductor IC. The inductor structure can include a coil of conductive material including a first terminal and a second terminal each located at an opposing end of the coil and a patterned ground shield including a plurality of fingers implemented within an IC process layer located between the coil of conductive material and a substrate layer of the IC. The inductor structure also can include an isolation wall having a high conductive material formed to encompass the coil and the patterned ground shield. The isolation wall can be coupled to one end of each finger.

The coil can be formed of a plurality of linear segments. For each of the plurality of linear segments of the coil, the plurality of fingers located below that linear segment can be substantially parallel and separated by a predetermined distance from one another. For example, each finger can be positioned substantially perpendicular to the linear segment of the coil beneath which that finger is located.

In one aspect, the isolation wall can be coupled to the substrate of the IC. In another aspect, the isolation wall can be coupled to a P-type diffusion material disposed within the substrate of the IC. The P-type diffusion material can couple the isolation wall to the substrate of the IC.

The isolation wall can include a plurality of vertically stacked conductive layers. Each pair of adjacent, vertically stacked conductive layers is coupled by a via. A highest conductive layer used to form the isolation wall can be implemented using a process layer at least as far from the substrate of the IC as a process layer used to form the coil. A lowest conductive layer used to form the isolation wall can be implemented using a process layer at least as close to the substrate of the IC as a process layer used to form the plurality of fingers.

Another embodiment can include an inductor structure implemented within a semiconductor IC. The inductor structure can include a coil of conductive material having a center terminal located at approximately a midpoint of a length of the coil. The coil can be substantially symmetrical with respect to a centerline bisecting the center terminal. The coil can include a first differential terminal and a second differential terminal each located at an end of the coil opposite the center terminal. The inductor structure also can include a patterned ground shield that has a plurality of first fingers implemented using a process layer located between the coil and a substrate of the IC. The patterned ground shield can have a center that is aligned with a center of the coil and an outer perimeter that encompasses an outer perimeter of the coil. The inductor structure further can include an isolation wall formed of a high conductive material encompassing the patterned ground shield. The isolation wall can be coupled to one end of each of the plurality of first fingers.

The plurality of first fingers can include a plurality of first finger groups. Each first finger within a same first finger group can be substantially parallel to each other first finger of the first finger group and can be substantially perpendicular to a segment of the coil associated with that first finger group.

The coil can include a first leg and a second leg each extending outward beyond the outer perimeter of the patterned ground shield. The first and second differential terminals of the coil can be coupled to the first and second legs respectively.

The inductor structure can include a plurality of second fingers located beneath the first and second legs of the coil. The plurality of second fingers can be substantially parallel with one another and can be substantially perpendicular to the first and second legs of the coil.

The inductor structure further can include a linear segment of P-type diffusion material located within the substrate of the IC and beneath the plurality of second fingers. The linear segment of P-type diffusion material can be coupled to each of the plurality of second fingers. The linear segment of P-type diffusion material can be oriented parallel to the first and second legs of the coil.

In one aspect, the isolation wall can be coupled to the substrate of the IC. The isolation wall, for example, can be coupled to the linear segment of P-type diffusion material.

The inductor structure also can include an IC circuit block that includes at least a first terminal coupled to the first differential terminal of the coil and a second terminal coupled to the second differential terminal of the coil. The IC circuit block can be located between the first and second legs of the coil. In another aspect, the circuit block can be located adjacent to an outer perimeter of the isolation wall. In another aspect, a ground metal can be located under the circuit block and can be formed of a low loss material.

Another embodiment can include an inductor structure implemented within a semiconductor IC. The inductor structure can include a coil of conductive material having a center terminal located at approximately a midpoint of a length of the coil. The coil can be substantially symmetrical with respect to a centerline bisecting the center terminal. The coil can include a first differential terminal and a second differential terminal each located at an end of the coil opposite the center terminal. The inductor structure can include a patterned ground shield having a plurality of fingers implemented using a process layer located between the coil and a substrate of the IC. The patterned ground shield can have a center that is aligned with a center of the coil and an outer perimeter that encompasses an outer perimeter of the coil. The inductor structure further can include an isolation ring including a low conductive material encompassing an outer perimeter of the patterned ground shield. The isolation ring can be coupled to one end of each of the plurality of fingers.

In one aspect, the isolation ring can be coupled to the substrate of the IC. In another aspect, the isolation ring can be formed of a P-type diffusion material implemented within the substrate of the IC. The P-type diffusion material can be coupled to each of the plurality of fingers of the patterned ground shield.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to an inductor structure for use within an IC. An inductor structure can be implemented that includes a patterned ground shield formed of groups of a plurality of parallel, conductive strips. The patterned ground shield of the inductor structure can isolate the electric field generated by current flow through the inductor structure from a substrate underlying the inductor structure. The patterned ground shield can be configured so as to not impede the magnetic field surrounding the coil(s) of the inductor structure.

The strips of the patterned ground shield can be coupled together at the outer perimeter of the patterned ground shield. A ring of conductive material can be used to couple the strips together. In an embodiment, the ring of conductive material can be formed to have a specified conductivity. The conductivity can be within one of a plurality of different conductivity ranges. By forming the ring of conductive material with a conductivity within a selected conductivity range, the quality factor, i.e., the "Q," of the inductor structure can be controlled and/or optimized.

Figure 1:
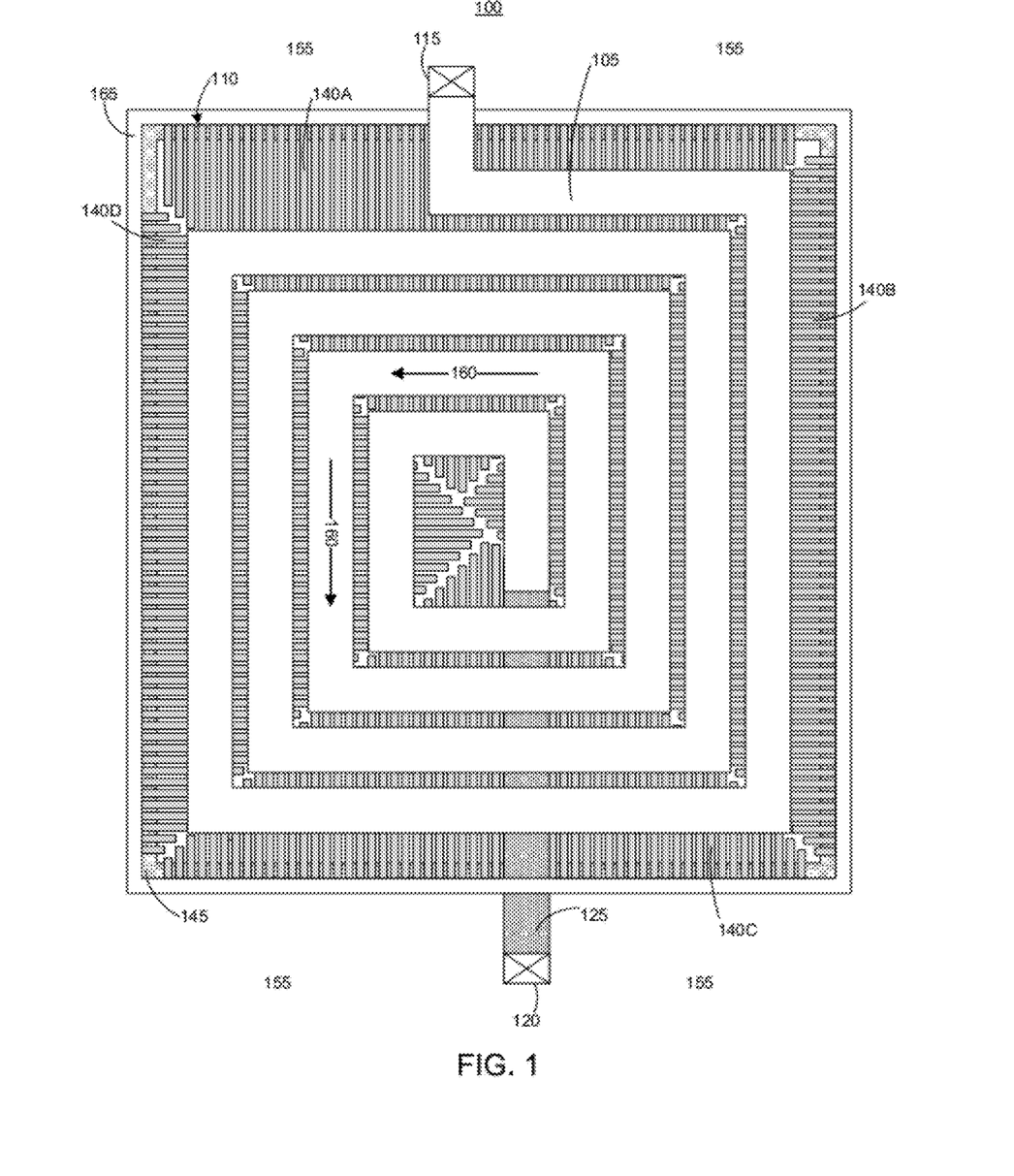
FIG. 1 is a first block diagram illustrating a topographical view of an inductor structure (inductor) for use within an integrated circuit (IC) in accordance with an embodiment disclosed within this specification.

FIG. 1 is a first block diagram illustrating a topographical view of an inductor structure 100 for use within an IC in accordance with an embodiment disclosed within this specification. Inductor structure (inductor) 100 can be implemented within an IC, e.g., as an IC inductor. As shown, inductor 100 can include a coil 105 and a patterned ground shield (PGS) structure 110. PGS structure 110 can provide isolation from substrate generated noise. Further, PGS structure 110 can serve to improve the "Q" of inductor 100.

Coil 105 can include a terminal 115, a terminal 120, and an interconnect 125 coupled to coil 105 using a via (not shown). Coil 105 can be implemented within one or more of a variety of process layers of an IC manufacturing process containing a high conductivity material. In an embodiment, coil 105 of inductor 100 can be implemented within the process layers containing the most conductive material of the IC manufacturing process. For example, the metal layers of the IC manufacturing process that are farthest from substrate 155 typically are considered highly, if not the most, conductive process layers and can be used to implement coil 105. It should be appreciated that, while illustrated as being formed in a single metal layer, coil 105 can be formed of two or more stacked metal layers that are coupled to one another using one or more vias.

Terminals 115 and 120 are located at distal ends of inductor 100. Terminals 115 and 120 can be used to couple inductor 100 to one or more other circuit elements within the IC in which inductor 100 is implemented. To make terminal 120 available outside an outer perimeter of coil 105, interconnect 125 can be formed using a metal layer that is not used to implement any turns of coil 105. Accordingly, the inner-most turn of coil 105 can be coupled to interconnect 125 using one or more vias as noted.

PGS structure 110 can be characterized by fingers 140. In an embodiment, coil 105 can be concentric with isolation ring 145 and isolation wall 165. For purposes of illustration, reference to isolation ring 145 within this specification also can refer to any contacts used to couple isolation ring 145 to metal structures located above isolation ring 145 unless otherwise indicated. Within FIG. 1, isolation wall 165 is immediately adjacent to isolation ring 145 with no intervening space. In another embodiment, however, isolation wall 165 can be larger than shown so that a substantially constant distance separates an outer edge of isolation ring 145 and an inner edge of isolation wall 165. In still another embodiment, isolation ring 145 can extend beneath isolation wall 165 or be located entirely beneath isolation wall 165 so that isolation ring 145 is not visible from the viewing angle illustrated in FIG. 1.

For purposes of illustration, fingers 140 are subdivided into four different groups of substantially parallel fingers illustrated as fingers 140A, fingers 140B, fingers 140C, and fingers 140D. Each finger of each group of fingers 140A-140D can couple to isolation ring 145 via one or more contacts (not shown) on one end of each respective finger 140 and extend inward toward a center of coil 105. Fingers 140A extend down from, and are substantially perpendicular to, a top edge of isolation ring 145. Fingers 140B extend left from, and are substantially perpendicular to, a right edge of isolation ring 145. Fingers 140C extend up from, and are substantially perpendicular to, a bottom edge of isolation ring 145. Fingers 140D extend right from, and are substantially perpendicular to, a left edge of isolation ring 145.

Each of fingers 140 can be formed as a metal strip using a process layer that is positioned between the process layer used to form coil 105 and substrate 155. Beneath each linear segment of coil 105, fingers 140 of PGS structure 110 that cross beneath and are in a same group are aligned in parallel with respect to one another. Also, pairs of adjacent fingers in a same group can be separated by a same predetermined distance. In an embodiment, the predetermined distance can be a minimum metal spacing allowed by the IC manufacturing process used to implement inductor 100.

For example, fingers 140A can be substantially parallel with respect to one another and substantially perpendicular to the linear segments of coil 105 beneath which each of fingers 140A is located. Further, fingers 140A can be separated from one another by a same predetermined spacing. Appreciably, fingers 140A are not perpendicular to the segment of coil 105 that couples directly to terminal 115. Fingers 140B can be substantially parallel with respect to one another and substantially perpendicular to the linear segments of coil 105 beneath which each of fingers 140B is located. Fingers 140B can be separated from one another by a same predetermined spacing. Fingers 140C are substantially parallel with respect to one another and substantially perpendicular to the linear segments of coil 105 beneath which each of fingers 140C is located. Fingers 140C can be separated from one another by a same predetermined spacing. Appreciably, fingers 140C are not perpendicular to the segment of coil 105 that couples directly to terminal 120. Fingers 140D are substantially parallel with respect to one another and substantially perpendicular to the linear segments of coil 105 beneath which each of fingers 140D is located. Fingers 140D can be separated from one another by a same predetermined spacing.

Within inductor 100, current flow is indicated by arrows 160. Accordingly, each of fingers 140 is oriented substantially perpendicular to the direction of current flow within the segment of coil 105 under which each of fingers 140 is located. By positioning fingers 140 in this manner, the impact of fingers 140 upon the magnetic field generated by the flow of current through coil 105 is reduced. Positioning fingers 140 in this manner can increase the efficiency of inductor 100 since the energy stored within the magnetic field surrounding the turns of coil 105 is not obstructed or dissipated by PGS structure 110.

In effect, fingers 140 of PGS structure 110 provide a continuous shield that resides beneath substantially all portions of coil 105. For example, PGS structure 110 can be implemented to extend to at least the outer perimeter defined by an outer edge of coil 105. In an embodiment, each of fingers 140 of PGS structure 110 can extend a predetermined distance beyond the outer perimeter of coil 105. For example, each of fingers 140 can extend a same distance or length beyond the outer perimeter of coil 105.

Isolation wall 165 can be configured to encompass coil 105 and fingers 140. Isolation wall 165 can be implemented with two or more conductive process layers of the IC manufacturing process used to implement inductor 100. Isolation wall 165 can be implemented using process layers such as those used to implement coil 105 or fingers 140, for example. In an embodiment, each metal layer of the IC manufacturing process used to implement inductor 100 can be stacked vertically to form isolation wall 165. In that case, each pair of vertically adjacent metal layers used to implement isolation wall 165 can be coupled together using one or more vias to form a continuous conductive structure, e.g., wall, around fingers 140.

As pictured in FIG. 1, each of fingers 140 can be coupled to isolation ring 145 via one or more contacts. In that case, isolation wall 165 can be excluded if so desired. In another embodiment, isolation wall 165 can be coupled to the end portion of each of fingers 140 that extends beyond the outer perimeter of coil 105. In that case, isolation wall 165 can be coupled to isolation ring 145 via a plurality of contacts, thereby coupling isolation wall 165 and fingers 140 to substrate 155.

PGS structure 110 can be coupled to a known potential within the IC in which inductor 100 is implemented. In a typical P-type substrate IC process, PGS structure 110 can be coupled to a same ground potential, or most negative potential, to which substrate 155 is coupled. Implemented in this manner, PGS structure 110 can form a ground plane that shields substrate 155 from the electric fields generated by currents flowing within inductor 100. In addition, PGS structure 110 can isolate inductor 100 from noise generated within substrate 155 by other circuit blocks operating within the IC in which inductor 110 is implemented.

Figure 2A:
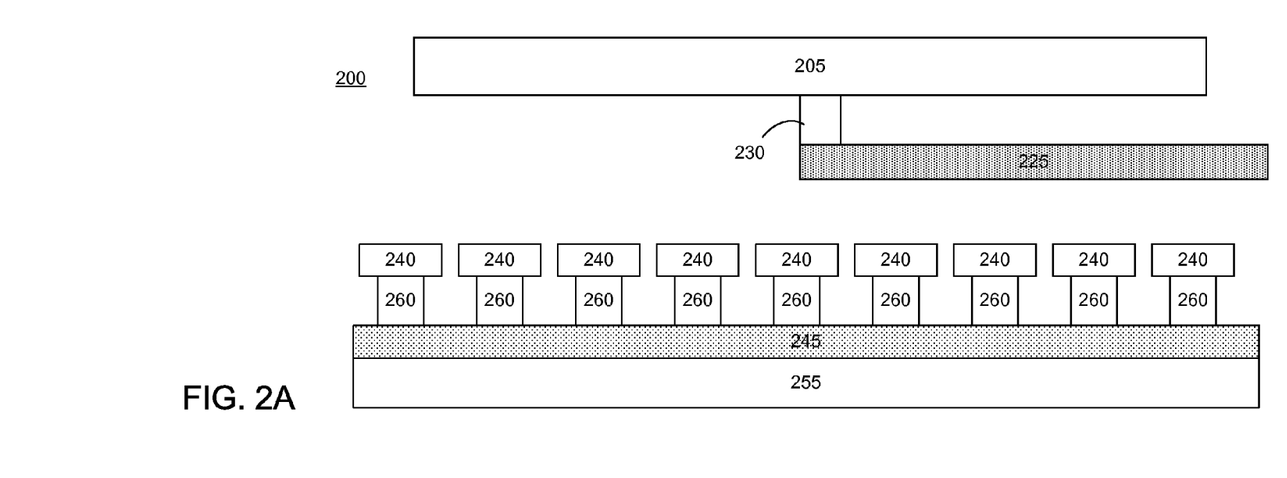
FIGS. 2A and 2B are second and third block diagrams each illustrating a side view of an inductor structure in accordance with another embodiment disclosed within this specification.
Figure 2B:
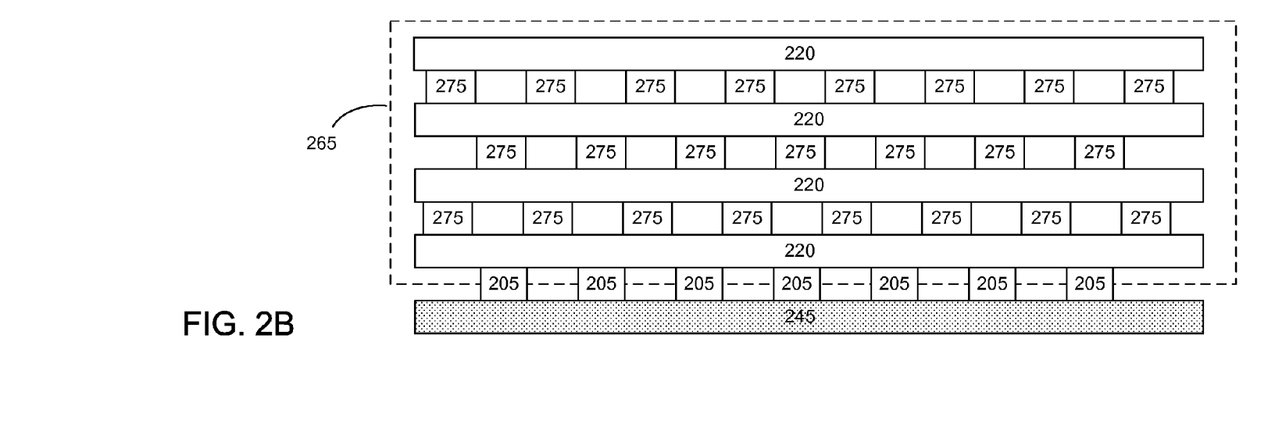

FIGS. 2A and 2B are second and third block diagrams each illustrating a side view of an inductor 200 in accordance with another embodiment disclosed within this specification. FIGS. 2A and 2B show a side view of an inductor 200, which can be implemented substantially as described with reference to inductor 100 of FIG. 1. FIGS. 2A and 2B are provided as exemplary illustrations. As such, FIGS. 2A and 2B are not drawn to the same scale as FIG. 1. Further, FIGS. 2A and 2B illustrate various aspects of inductor 200 that are not visible from the topographical view presented in FIG. 1.

FIG. 2A illustrates a side view of inductor 200 in which the isolation wall, e.g., isolation wall 165 of FIG. 1, is not shown. As pictured, coil 205 of inductor 200 is disposed within and an upper metal layer, e.g., a metal layer farther or farthest from substrate 255 of the IC manufacturing process used to implement inductor 200. Although pictured in FIG. 2A as being implemented using a single metal layer, coil 205 can be implemented using two or more vertically stacked metal layers. In that case, adjacent metal layers of coil 205 can be coupled with one or more vias.

It also should be appreciated that coil 205 can be implemented within one or more metal layers located closer, or closest, to substrate 255. Typically, within an IC manufacturing process, metal layers located farther from substrate 255 can be the thicker than those that are located closer to substrate 255. Thus, the metal layers farther from substrate 255 tend to have a higher or highest level of conductivity of the available process layers. Therefore, implementing coil 205 in the metal layers farthest from substrate 255 typically provides superior inductor characteristics, for example, lower series resistance for inductor 200. Accordingly, implementation of coil 205 with a single conductive layer that is located farthest from substrate 255 as described within this specification is provided for purposes of illustration only and is not intended as a limitation of the one or more embodiments disclosed herein.

Interconnect 225 is coupled to coil 205 with one or more of vias 230. Interconnect 225 can be implemented in a metal layer that is different from the metal layer used to implement coil 205. Using a different metal layer for interconnect 225 allows the end portion of coil 205, i.e., the end of the innermost turn of coil 205, to be routed out of coil 205 for coupling to additional IC circuit devices. Although pictured within FIG. 2A as being implemented with a single metal layer, interconnect 225 can be implemented with two or more vertically stacked layers of metal. In that case, each adjacent layer in the metal stack forming interconnect 225 can be coupled with one or more vias.

It should be appreciated that interconnect 225 can be implemented within one or more metal layers located above coil 205, i.e., farther from substrate 255 than coil 205. As such, the implementation of interconnect 225 with a single conductive layer located beneath coil 205 as shown within FIG. 2A is provided for purposes of illustration and is not intended as a limitation of the one or more embodiments disclosed herein.

Fingers 240 generally are oriented perpendicular to the direction of current flow in the segment of coil 205 under which each of fingers 240 is located. Within FIG. 2A, only a single group of fingers 240 is illustrated. As shown, each of fingers 240 can be implemented using the metal layer closest to substrate 255. Typically, implementing the PGS structure as close to substrate 255 as possible provides superior isolation between coil 205 and substrate 255. Although illustrated as being implemented in the metal layer closest to substrate 255, fingers 240 can be implemented within any conductive process layer residing between substrate 255 and coil 205. As such, the depiction of fingers 240 being formed the metal layer closest to substrate 255 within this specification is for purposes of illustration only and is not intended as a limitation of the one or more embodiments disclosed.

In an embodiment, each of fingers 240 can couple at one end to isolation ring 245. Isolation ring 245 can be sized to encompass the entirety of the outer perimeter of coils 205. As shown in FIG. 2A, each of fingers 240 can couple to isolation ring 245 through one of contacts 260. Isolation ring 245, for example, can be coupled to a ground potential of the IC to create a known constant potential within each of fingers 240 coupled thereto and the portion of substrate 255 located within isolation ring 245. As noted with respect to FIG. 1, reference to isolation ring 245 within this specification also includes contacts 260 (or contacts 205 of FIG. 2B) unless otherwise indicated or as indicated by context. Isolation ring 245 can be implemented with a low conductivity material such as, for example, a P-type or a P-plus type of diffusion implant. In this manner, each of fingers 240 can be coupled together with low conductance material(s).

FIG. 2B illustrates a side view of inductor 200 in which isolation wall 265 is shown. Isolation wall 265 can be implemented substantially as described with reference to isolation wall 165 of FIG. 1. As noted, the PGS structure can be implemented with fingers 240 being coupled to isolation ring 245 and, as a result, to substrate 255 (not shown in FIG. 2B). The PGS structure, however, also can be implemented in a variety of other configurations.

For example, within FIG. 2B, isolation wall 265 is depicted as being coupled to isolation ring 245 using contacts 205. As such, isolation wall 265 is coupled to substrate 255. In an embodiment, fingers 240 of the PGS structure can be directly coupled to isolation wall 265 as opposed to isolation ring 245. Using this approach, the end portion of each finger 240 can be coupled together using a high conductance material of isolation wall 265, e.g., metal.

As illustrated in FIG. 2B, isolation wall 265 can include two or more metal layers 220 that are vertically stacked. Each pair of vertically adjacent metal layers 220 can be coupled together using one or more of vias 275. The inter-coupling of multiple metal layers 220 can create a high conductance layer that can be used to couple adjoining fingers 240 within the PGS structure.

In an embodiment, a highest conductive layer used to form isolation wall 265, e.g., the top metal layer 220 shown in FIG. 2B, can be located at least as far from substrate 255 as the conductive layer used to form coil 205. For example, the highest metal layer 220 can be formed using a same process layer as is used to form coil 205, but also can be built higher so that the highest process layer of isolation wall 265 is farther from substrate 255 than the process layer used to form coil 205. Further, a lowest conductive layer, e.g., the lowest metal layer 220 shown in FIG. 2B, used to form isolation wall 265 can be located at least as close to substrate 255 as a process layer used to form fingers 240. For example, a lowest metal layer 220 of isolation wall 265 can be implemented using a same process layer as is used to form fingers 240, but also can be formed using a process layer that is located lower, e.g., closer to substrate 255, than the process layer used to form fingers 240.

Figure 3:
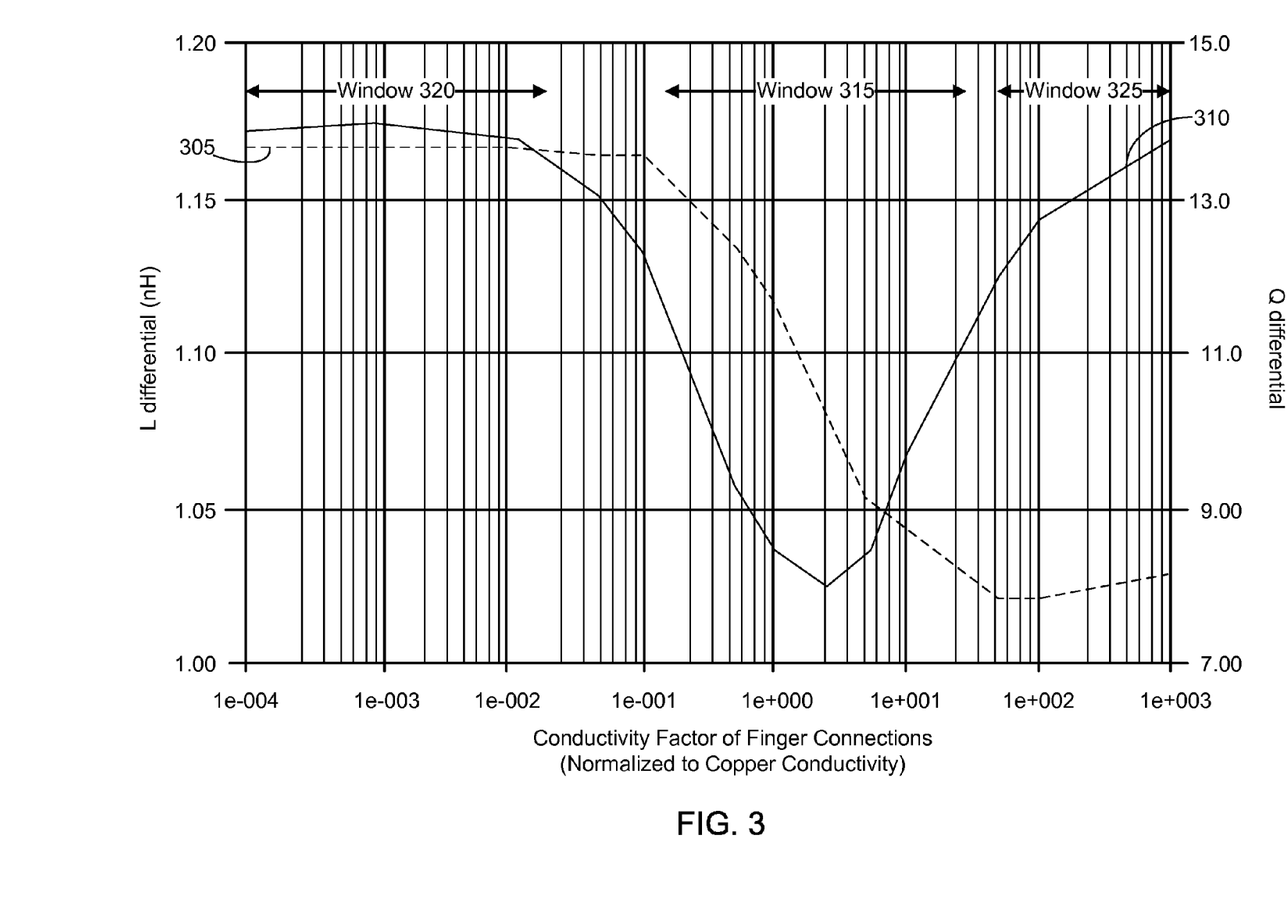
FIG. 3 is a graph illustrating the influence of conductance of the material used to couple fingers of a patterned ground shield structure on the inductive and lossy characteristics of an IC inductor in accordance with another embodiment disclosed within this specification.

FIG. 3 is a graph illustrating the influence of the conductance of the material used to couple fingers of a PGS structure on the inductive and lossy characteristics of an IC inductor in accordance with another embodiment disclosed within this specification. FIG. 3 illustrates the effects of the conductance of the material used to couple individual ones of the fingers of the PGS structure on the inductive value of the inductor in which the PGS structure is incorporated as well as the Q of the inductor. The graph of FIG. 3 illustrates an inductance plot 305 and a Q plot 310. The vertical axis is demarcated in nanohenries. The horizontal axis represents conductivity and is demarcated in units that have been normalized to Copper conductivity. The values illustrated by the graph of FIG. 3 are derived from three dimensional electromagnetic simulations.

In a conventional IC inductor that utilizes a metal PGS structure, the entire PGS structure is composed of a single, uninterrupted metal layer, e.g., a metal sheet. The uninterrupted PGS structure effectively isolates the substrate under the conventional inductor from the electromagnetic field generated by the AC currents flowing within the coil of the conventional inductor. In addition, the uninterrupted PGS structure isolates the conventional inductor from noise that can propagate from other circuit blocks that neighbor the conventional inductor. Within the conventional inductor, however, the magnetic field created by AC currents flowing therein generate currents within the uninterrupted PGS structure. The currents induced within the uninterrupted PGS structure of the conventional inductor structure can result in energy losses that can degrade the Q of the conventional inductor.

Referring again to FIG. 3, Q and correlated conductance of the material used to interconnect the fingers of the PGS structure is illustrated. Window 315 shows a region of FIG. 3 in which Q plot 310 is degraded. The degradation of Q associated with the PGS structure results in an inductor structure that is inadequate for radio frequency (RF) IC circuits. Q plot 310 demonstrates that two ranges of conductance for the material used to interconnect the fingers of the PGS structure can result in improved Q for an inductor.

Window 320 illustrates that decreased conductance of the material used to interconnect the fingers of the PGS structure corresponds with an increase in Q and inductance of the inductor. The increase in Q demonstrated by Q plot 310 and the increase in inductance demonstrated by inductance plot 305 that occur within window 320 result from the low conductance of the material used to interconnect the fingers of the PGS structure preventing currents from flowing between the fingers. The currents that are prevented, or inhibited, from flowing between the fingers of the PGS structure are induced by the electric field that is generated by AC currents within the inductor. Preventing the current flow between fingers can decrease resistive losses within the PGS structure that tend to increase the Q of the inductor.

Window 325 illustrates that increased conductance of the material used to interconnect the fingers of the PGS structure corresponds to an increase in Q and a decrease in inductance of the inductor. The increase in Q demonstrated by Q plot 310 and the decrease in inductance demonstrated by inductance plot 305 that occur within window 325 result from the high conductance of the material used to interconnect the fingers of the PGS structure significantly reducing the resistance between the fingers. Reducing the inter-finger resistance, e.g., the resistance between fingers, can decrease the resistive losses that occur within the PGS structure that tend to increase the Q of the inductor.

Figure 4:
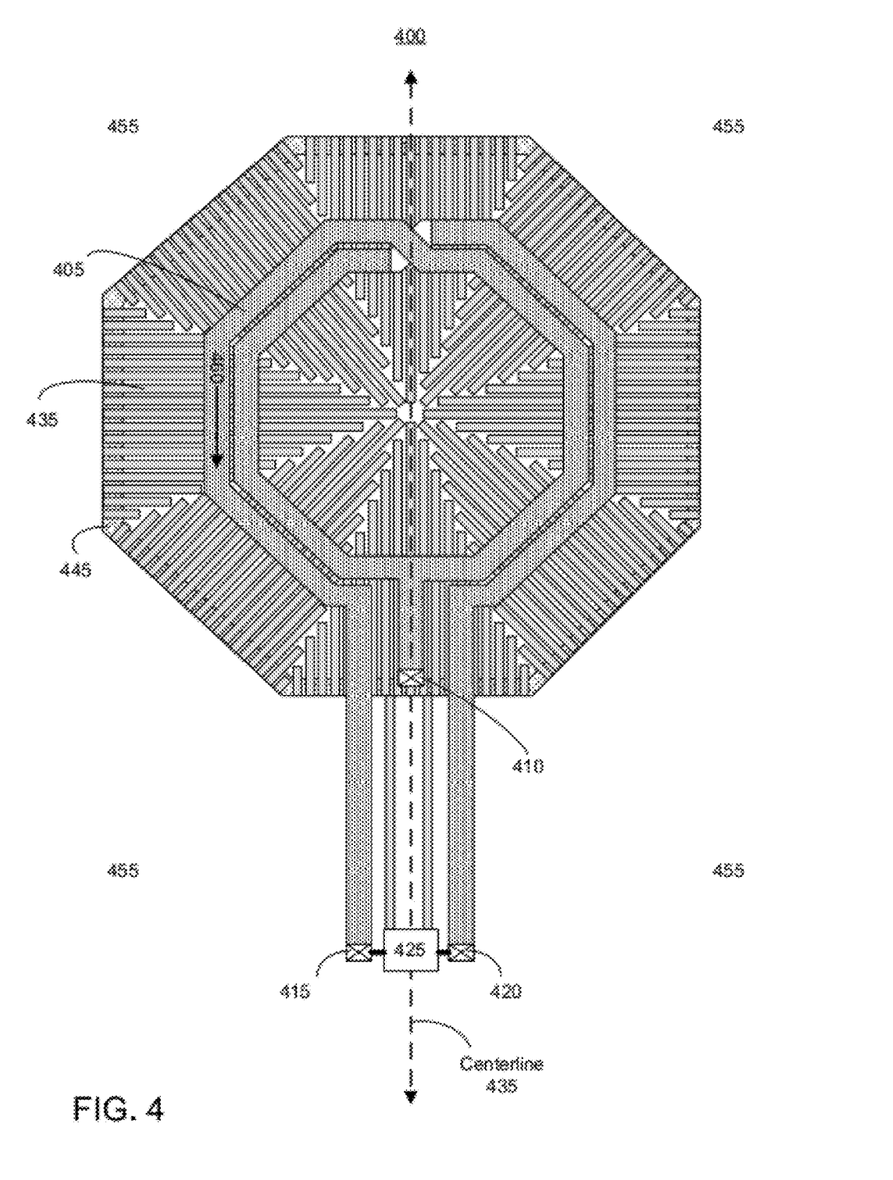
FIG. 4 is a fourth block diagram illustrating a topographical view of an inductor in accordance with another embodiment disclosed within this specification.

FIG. 4 is a fourth block diagram illustrating a topographical view of an inductor 400 in accordance with another embodiment disclosed within this specification. FIG. 4 illustrates a physical layout of inductor 400 within an IC. As shown, inductor 400 is pictured as a two turn, center tap inductor. Inductor 400 can be implemented to utilize properties illustrated in window 320 of FIG. 3, e.g., low conductivity in the material used to interconnect fingers of the PGS structure.

Inductor 400 can include a coil 405, a center terminal 410, differential terminals (terminals) 415 and 420, a circuit block 425, and an isolation ring 445. As shown, circuit block 425 can couple to the linear segments, e.g., "legs," of coil 405 that extend outward past isolation ring 445. Circuit block 425 can couple to legs of coil 405, e.g., to terminals 415 and 420, via one or more connections or terminals as shown. In an embodiment, a ground metal can be located and implemented under circuit block 425 and can be formed of a low loss material.

Although denoted as four distinct objects for descriptive purposes within this specification, coil 405, center terminal 410, and terminals 415 and 420 are coupled together and can represent one continuous area of conductive material. In addition, though implemented as one continuous area or segment of conductive material, coil 405, center terminal 410, and terminals 415 and 420 can be implemented within one or more different conductive, e.g., metal, process layers of the IC. The conductive layers can be coupled together using one or more vias to create one continuous conductive pathway.

Coil 405 can be implemented as a symmetrical, two turn coil of inductor 400. A centerline 435 can be determined that symmetrically bisects, or substantially symmetrically bisects, coil 405. Although implemented as an octagonal coil within FIG. 4, coil 405 can be implemented in any of a variety of forms or shapes that can be implemented using available IC manufacturing processes so long as the symmetry of coil 405 about centerline 435 is retained. As such, the implementation of coil 405 as an octagonal coil within inductor 400 is provided for purposes of illustration and is not intended as a limitation of the one or more embodiments disclosed within this specification.

A PGS structure can be implemented between the conductive process layer used to implement coil 405 and substrate 455. The PGS structure can reside beneath, and extend beyond, an outer perimeter defined by an outer edge of coil 405. The PGS structure can include, and thus, be characterized by, a plurality of fingers 435 and an isolation ring 445. Each of fingers 435 can be positioned substantially perpendicular to the segment of coil 405 beneath which that finger 435 extends. As such, each finger 435 is substantially perpendicular to the flow of current through that segment of coil 405. As pictured in FIG. 4, each finger 435 of the PGS structure is coupled on one end to isolation ring 445. Coil 405 can be concentric with isolation ring 445, which is positioned to encompass coil 405 by substantially a constant distance from the outer edge of coil 405.

Isolation ring 445 can be located along the distal end of each finger 435 within the PGS structure of inductor 400 that extends outward past the outer perimeter of coil 405. Each finger 435 can be coupled to isolation ring 445 on one end, e.g., at the "distal" end, with one or more contacts (not shown). Isolation ring 445 can be formed or composed of a low conductance material having a conductance that is within the range defined by window 320 of FIG. 3. In an embodiment, the material used to implement isolation ring 445 can be a low conductance, P-type diffusion that is implanted within substrate 455. Coupling together fingers 435 of inductor 400 with the high resistance material of the P-type diffusion can reduce current flow between fingers 435. The reduced current flow between fingers 435 can lead to losses within inductor 400. Reducing these resistive losses can improve the Q of inductor 400.

Figure 5:
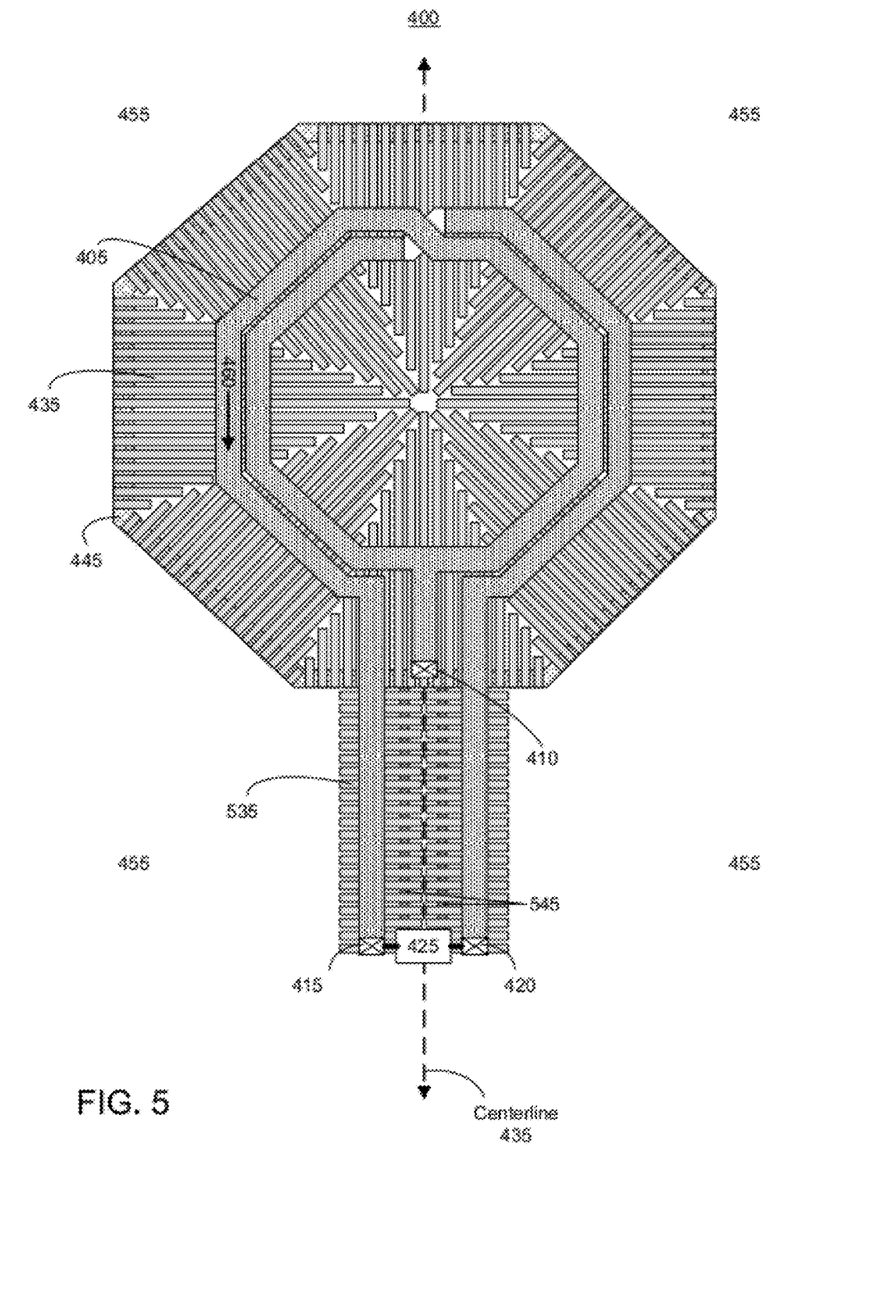
FIG. 5 is a fifth block diagram illustrating a topographical view of the inductor of FIG. 4 in accordance with another embodiment disclosed within this specification.

FIG. 5 is a fifth block diagram illustrating a topographical view of inductor 400 of FIG. 4 in accordance with another embodiment disclosed within this specification. More particularly, FIG. 5 illustrates an embodiment having a physical refinement that can improve the Q of inductor 400.

Referring to FIG. 5, parallel fingers 535 are located beneath the segments of coil 405 that extend beyond the turns of coil 405 and isolation ring 445 of the PGS structure of inductor 400 to form differential terminal 415 and 420. Fingers 535, which can be implemented as metal strips substantially similar to fingers 435, can be coupled to linear segments 545. In an embodiment, linear segments 545 can couple to isolation ring 445. Linear segments 545 can be formed of the same low conductance material that is used to form isolation ring 445. Each of fingers 535 can be coupled to linear segments 545 through one or more contacts (not shown). In the example pictured in FIG. 5, fingers 535 can be arranged in two columns, where each column is positioned beneath one leg of coil 405. Each of fingers 535 is substantially perpendicular to the legs of coil 405.

The addition of fingers 535 and linear segments 545 beneath the legs of coil 405 prevent the generation of eddy currents within substrate 455 from electromagnetic fields associated with currents flowing through inductor 400. By coupling together fingers 535 beneath the legs of coil 405 using linear segments 545, current is prevented from flowing between fingers 535. Decreasing the ability to generate eddy currents within substrate 455 and preventing resistive losses within fingers 535 beneath the legs of coil 405 can further reduce losses that can be incurred within inductor 400. This reduction in loss further can improve the Q of inductor 400.

Figure 6:
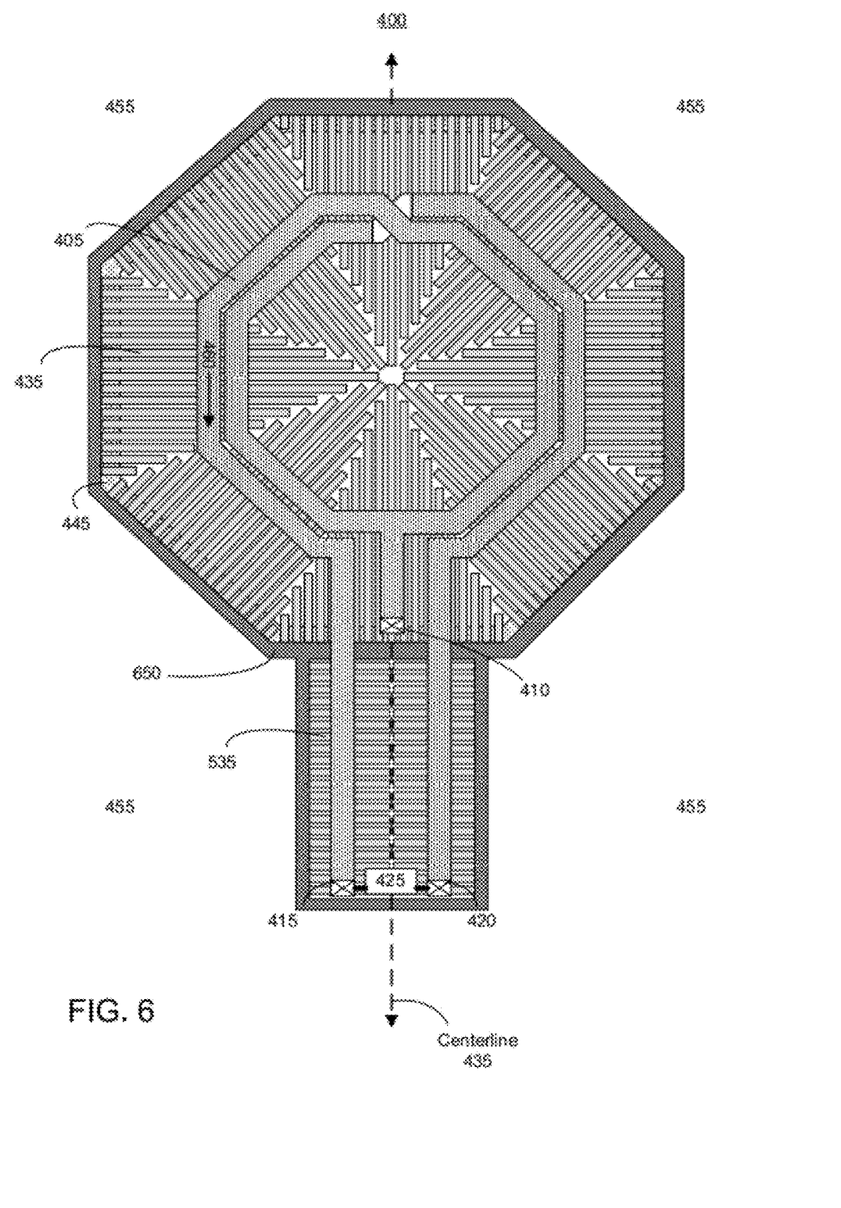
FIG. 6 is a sixth block diagram illustrating a topographical view of the inductor of FIG. 4 in accordance with another embodiment disclosed within this specification.

FIG. 6 is a sixth block diagram illustrating a topographical view of inductor 400 of FIG. 4 in accordance with another embodiment disclosed within this specification. FIG. 6 illustrates a physical refinement of inductor 400 that can provide additional Q improvement of inductor 400. FIG. 6 illustrates an embodiment that makes use of highly conductive material. The conductive material utilized in FIG. 6, for example, can have a conductivity that is within a range defined by window 325 of FIG. 3. The conductive material can be used to couple fingers 435 and 535 within the PGS structure of inductor 400. Inductor 400 further can include isolation wall 650.

Referring to FIG. 6, the outer perimeter of the PGS structure of inductor 400 is surrounded by an isolation wall 650. As previously described, an isolation wall such as isolation wall 650 can include two or more metal layers that are vertically stacked. Each pair of vertically adjacent metal layers can be coupled together using one or more vias. The inter-coupling of multiple metal layers creates a high conductance path that can be used to couple adjoining fingers 435 of the PGS structure and fingers 535. In this manner, each pair of adjoining fingers can be coupled with a high conductance material.

In an embodiment, the metal layer(s) used to implement isolation wall 650 can include one or more or all metal layers of the IC manufacturing process in which inductor 400 is implemented. In another embodiment, isolation wall 650 can include, at least, the metal layers used to implement coil 405 and the metal layer used to implement the PGS structure of inductor 400, e.g., the metal layer used to implement fingers 435 and/or 535. In either case, each pair of vertically adjacent metal layers can be coupled by one or more vias or stacks of vias.

As discussed, using a material that has a conductance within window 325 of FIG. 3 to connect fingers 435 and 535 of the PGS structure effectively decreases the resistance of the material connecting the metal strips of the PGS structure. Decreasing this resistance decreases resistive losses in the PGS structure of inductor 400 and, accordingly, increases the Q of inductor 400. The increase in Q associated with window 325 results from the high conductance of the material connecting the fingers 435 and 535 of the PGS structure, which greatly reduces the resistance between fingers 435 and 535 within the PGS structure.

In an embodiment, the portion of isolation wall 650 through which each of the legs of coil 405 crosses can be at least partially discontinuous. More particularly, one or more conductive layers used to form isolation wall 650 can be discontinued or interrupted so as to allow each of the legs of coil 405 to cross isolation wall 650. Though one or more conductive layers that form isolation wall 650 can have a discontinuity to allow each respective leg to pass, it should be appreciated that not all layers of isolation wall 650 need have a discontinuity or gap.

Isolation ring 445 can be located beneath isolation wall 650. Isolation ring 445 can be coupled to the lowest metal layer used to form isolation wall 650 using one or more contacts. As noted, isolation ring 445 can be sized as shown, can extend beneath isolation wall 650, or can be located completely beneath isolation wall 650 so as to not be visible in the example shown.

Figure 7:
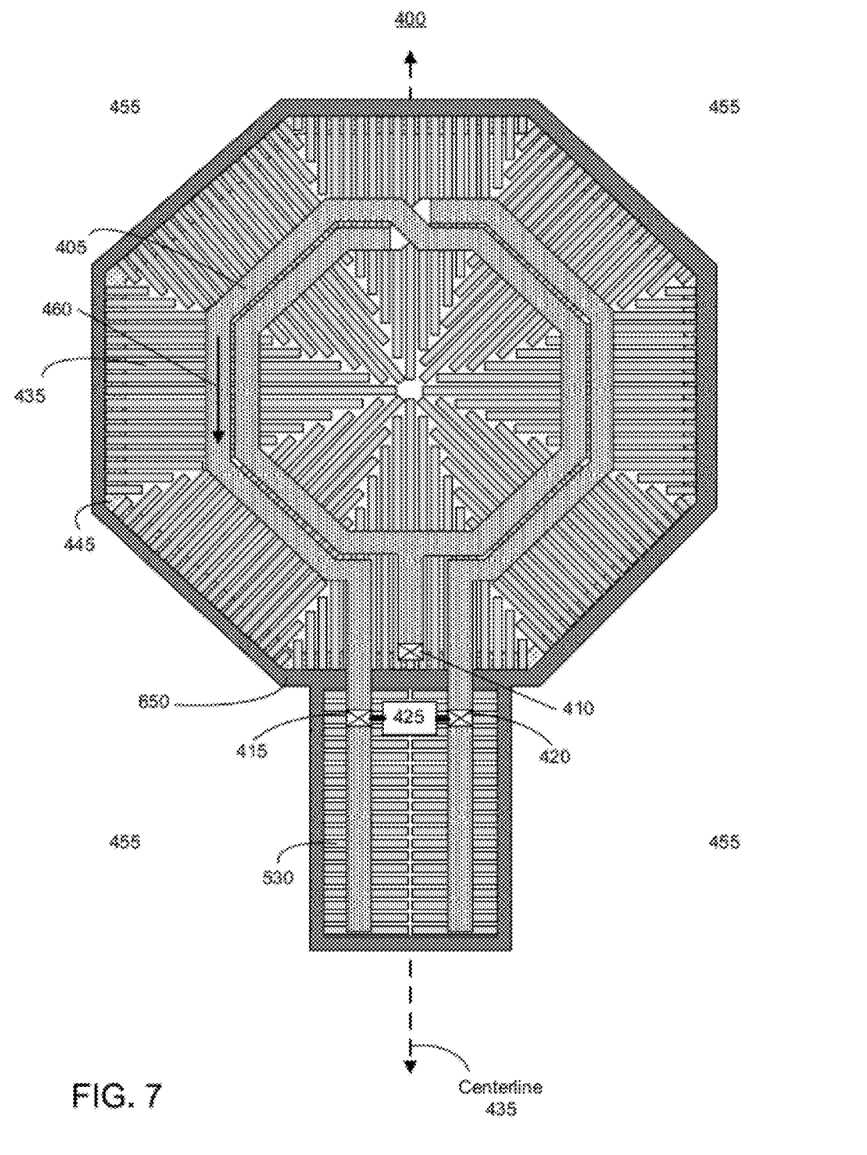
FIG. 7 is a seventh block diagram illustrating a topographical view of the inductor of FIG. 4 in accordance with another embodiment disclosed within this specification.

In an embodiment, fingers 435 and 535 can be formed using a lowest metal layer that is used to form isolation wall 650. In this regard, fingers 435 and 535 can be formed as part of the isolation wall FIG. 7 is a seventh block diagram illustrating a topographical view of inductor 400 of FIG. 4 in accordance with another embodiment disclosed within this specification. FIG. 7 illustrates an embodiment in which a further physical refinement of inductor 400 is shown that can increase the Q of inductor 400.

Typically inductors are used as RF circuit components within an IC. For example, a center tap inductor such as inductor 400 is often used when implementing a differential RF voltage controlled oscillator (VCO). In that case, circuit block 425 can be a cross coupled gm cell that forms the core of the RF VCO. The physical location of the source connections of the gm cell, also representing an electrical node, can correspond to a virtual AC ground of the RF VCO circuit for differential current flowing within coil 405.

As used within this specification, the term "virtual AC ground," can refer to a node of a circuit that is maintained at a steady voltage potential when sourcing or sinking AC current without being directly physically coupled to a reference voltage potential. In an embodiment, circuit block 425 can be repositioned along the linear segments of coil 405. A virtual AC ground can be located within circuit block 425, e.g., at a node where two sources of a differential transistor pair of the gm cell are coupled. The virtual AC ground within circuit block 425 can be coupled to an actual ground of the IC in the same or similar manner as isolation wall 650, e.g., where multiple conductive layers are vertically coupled through vias to form a low loss path, thereby providing further improvement in Q for inductor 400.

In addition, shifting the position of circuit block 425 to a location that is substantially adjacent to a portion of the isolation wall 650 where legs of coil 405 extend beyond can provide additional Q improvement in inductor 400. Referring to FIG. 7, the location of circuit block 425 and terminals 415 and 420 has been altered from residing at or about endpoints of the legs of coil 405, e.g., farther away from coil 405 as shown in FIG. 6, to the location illustrated in FIG. 7.

Figure 8:
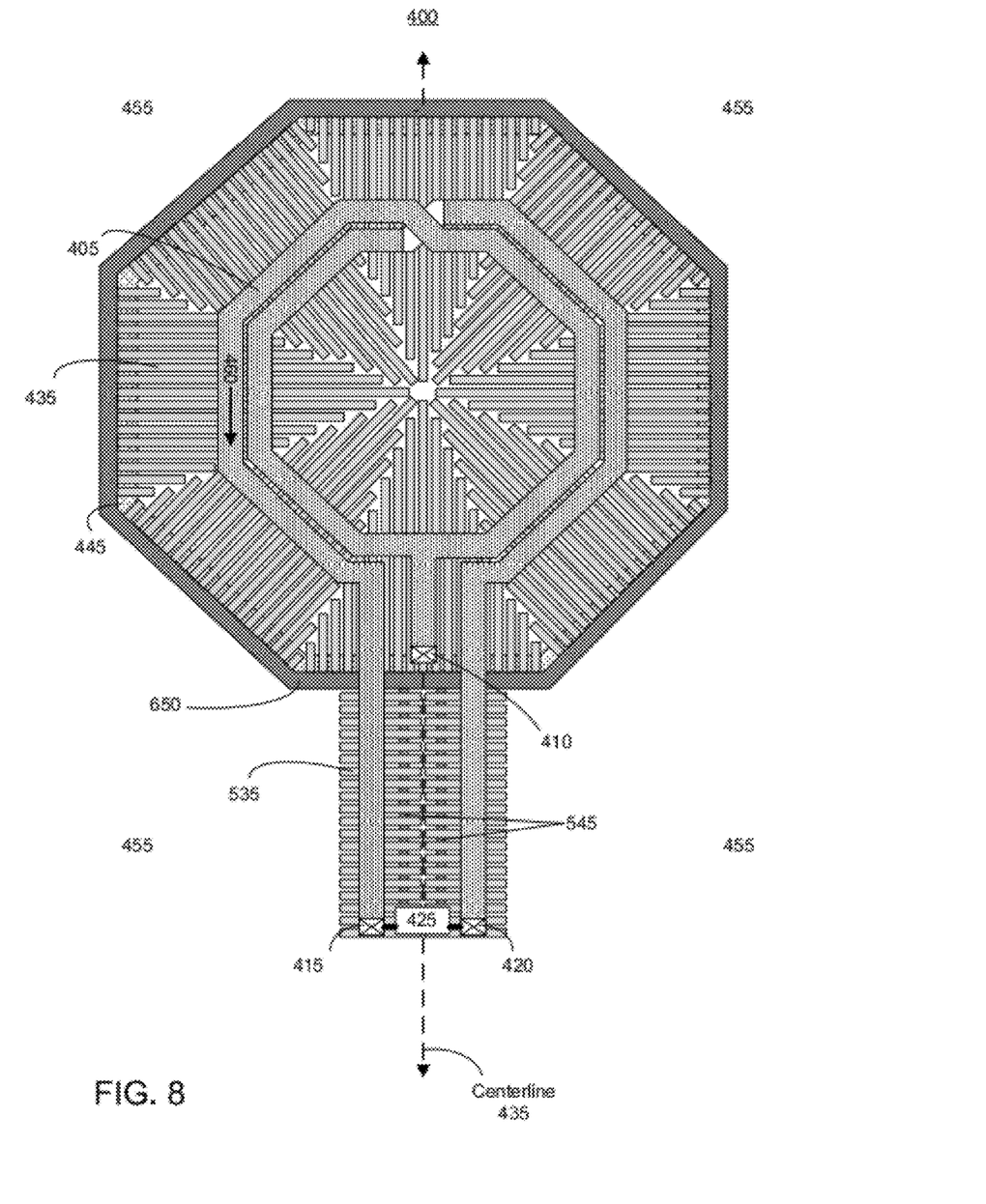
FIG. 8 is an eighth block diagram illustrating a topographical view of the inductor of FIG. 4 in accordance with another embodiment disclosed within this specification.

FIG. 8 is an eighth block diagram illustrating a topographical view of the inductor of FIG. 4 in accordance with another embodiment disclosed within this specification. FIG. 8 illustrates an embodiment in which isolation wall 650 surrounds only coils 405 of inductor 400. Accordingly, whereas fingers 435 can couple to isolation wall 650 as described with reference to FIGS. 6 and 7, fingers 535 can couple to linear segments 545 via a plurality of contacts. Linear segments 545 can couple to isolation ring 445 disposed beneath isolation wall 650. In the example pictured in FIG. 8, circuit 425 is located near the ends of the legs of coil 405. In this regard, contacts 415 and 420 also are located near the ends of the legs, e.g., at approximately a farthest location on the legs away from coil 405.

Figure 9:
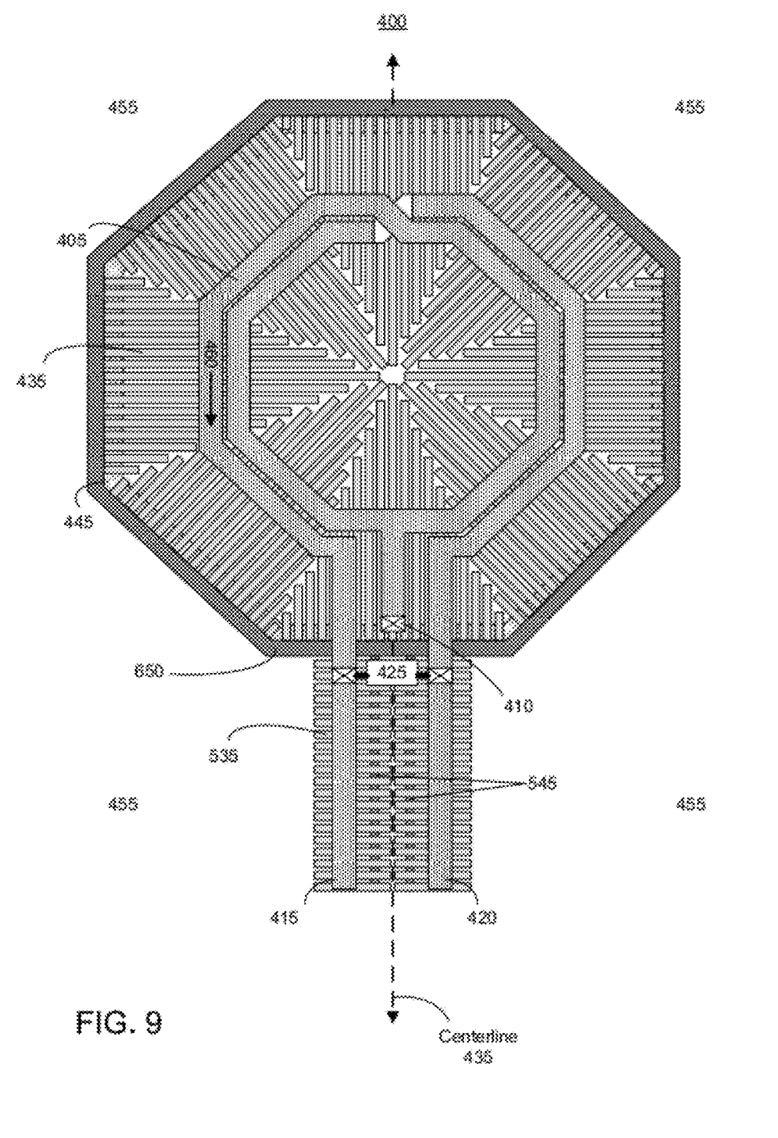
FIG. 9 is a ninth block diagram illustrating a topographical view of the inductor of FIG. 4 in accordance with another embodiment disclosed within this specification.

FIG. 9 is a ninth block diagram illustrating a topographical view of the inductor of FIG. 4 in accordance with another embodiment disclosed within this specification. FIG. 9, like FIG. 8, illustrates an embodiment in which isolation wall 650 surrounds only coils 405 of inductor 400. Fingers 435 can couple to isolation wall 650 as described with reference to FIGS. 6 and 7. Fingers 535 can couple to linear segments 545 via a plurality of contacts. In the example pictured in FIG. 9, circuit 425 is located near the ends of the legs of coil 405 that are closest to coil 405. In this regard, contacts 415 and 420 also are located at or about the ends of the legs, e.g., at approximately a closest location on the legs to coil 405.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An inductor structure implemented within a semiconductor integrated circuit (IC), the inductor structure comprising:
   a coil of conductive material comprising a first terminal and a second terminal each located at an opposing end of the coil;
   a patterned ground shield comprising a plurality of fingers implemented within an IC process layer located between the coil of conductive material and a substrate of the IC; and
   an isolation wall comprising a high conductive material formed to encompass the coil and the patterned ground shield,
   wherein the isolation wall is coupled to one end of each finger.

2. The inductor structure of claim 1, wherein the coil is formed of a plurality of linear segments, and
   wherein for each of the plurality of linear segments of the coil, the plurality of fingers located below that linear segment are substantially parallel and separated by a predetermined distance from one another.

3. The inductor structure of claim 1, wherein each finger is straight and positioned substantially perpendicular to the linear segment of the coil beneath which the each finger is located.

4. The inductor structure of claim 1, wherein the isolation wall is coupled to the substrate of the IC.

5. The inductor structure of claim 4, wherein:
   the isolation wall is coupled to a P-type diffusion material disposed within the substrate of the IC; and
   the P-type diffusion material couples the isolation wall to the substrate of the IC.

6. The inductor structure of claim 1, wherein:
   the isolation wall comprises a plurality of vertically stacked conductive layers; and
   each pair of adjacent, vertically stacked conductive layers is coupled by a via.

7. The inductor structure of claim 6, wherein a highest conductive layer used to form the isolation wall is implemented using a process layer at least as far from the substrate of the IC as a process layer used to form the coil.

8. The inductor structure of claim 6, wherein a lowest conductive layer used to form the isolation wall is implemented using a process layer at least as close to the substrate of the IC as a process layer used to form the plurality of fingers.

9. The inductor structure of claim 1, wherein:
   the coil of conductive material comprises a center terminal located at a midpoint of a length of the coil;
   the coil is symmetrical with respect to a centerline bisecting the center terminal; and
   the patterned ground shield has a center that is aligned with a center of the coil.

10. The inductor structure of claim 9, wherein:
    the plurality of fingers comprises a plurality of finger groups; and
    each finger within a same finger group is substantially parallel to each other finger of the finger group and is substantially perpendicular to a segment of the coil associated with the same finger group.

11. The inductor structure of claim 9, wherein:
    the coil comprises a first leg and a second leg each extending outward beyond an outer perimeter of the patterned ground shield; and
    the first and second terminals of the coil are coupled to the first and second legs respectively.

12. The inductor structure of claim 11, further comprising a plurality of second fingers located beneath the first and second legs of the coil,
    wherein the plurality of second fingers are substantially parallel with one another and are substantially perpendicular to the first and second legs of the coil.

13. The inductor structure of claim 12, further comprising a linear segment of P-type diffusion material located within the substrate of the IC and beneath the plurality of second fingers,
    wherein the linear segment of P-type diffusion material is coupled to each of the plurality of second fingers, and
    wherein the linear segment of P-type diffusion material is oriented parallel to the first and second legs of the coil.

14. The inductor structure of claim 9, wherein the isolation wall is coupled to the substrate of the IC.

15. The inductor structure of claim 14, wherein the isolation wall is coupled to the linear segment of P-type diffusion material.

16. The inductor structure of claim 11, further comprising an IC circuit block comprising at least a first terminal coupled to the first terminal of the coil and a second terminal coupled to the second terminal of the coil,
    wherein the IC circuit block is located between the first and second legs of the coil.

17. The inductor structure of claim 16, wherein:
    the IC circuit block is located adjacent to an outer perimeter of the isolation wall; and
    a ground metal located under the circuit block is formed of a low loss material.

18. The inductor structure of claim 1, further comprising:
    an isolation ring comprising a low conductive material encompassing an outer perimeter of the patterned ground shield, the isolation ring being coupled to the isolation wall,
    wherein the isolation wall is coupled to one end of each finger via the isolation ring.

19. The inductor structure of claim 18, wherein the isolation ring is coupled to the substrate of the IC.

20. The inductor structure of claim 18, wherein:
    the isolation ring comprises a P-type diffusion material implemented within the substrate of the IC; and
    the P-type diffusion material is coupled to each of the plurality of fingers of the patterned ground shield.

* * * * *